US008575738B2

(12) United States Patent
Doi et al.

(10) Patent No.: US 8,575,738 B2
(45) Date of Patent: Nov. 5, 2013

(54) SEMICONDUCTOR MEMORY CARD

(75) Inventors: Kazuhide Doi, Yokohama (JP); Naohisa Okumura, Kamakura (JP); Taku Nishiyama, Yokohama (JP); Katsuyoshi Watanabe, Fujisawa (JP); Takeshi Ikuta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 77 days.

(21) Appl. No.: 13/408,392

(22) Filed: Feb. 29, 2012

(65) Prior Publication Data

US 2012/0241933 A1 Sep. 27, 2012

(30) Foreign Application Priority Data

Mar. 24, 2011 (JP) ................................ 2011-065473
Nov. 4, 2011 (JP) ................................ 2011-242191

(51) Int. Cl.
*H01L 23/495* (2006.01)

(52) U.S. Cl.
USPC ..... 257/676; 257/666; 257/777; 257/E23.052

(58) Field of Classification Search
USPC .................. 257/666, 676, 723, 777, E23.052
See application file for complete search history.

(56) References Cited

U.S. PATENT DOCUMENTS

| 5,822,190 | A | 10/1998 | Iwasaki | |
|---|---|---|---|---|
| 6,085,412 | A | 7/2000 | Iwasaki | |
| 6,900,527 | B1 | 5/2005 | Miks et al. | |
| 7,352,057 | B2 * | 4/2008 | Grafe et al. | 257/686 |
| 7,989,910 | B2 * | 8/2011 | Saito et al. | 257/493 |
| 8,319,352 | B2 * | 11/2012 | Shinohara et al. | 257/777 |
| 2003/0227075 | A1 | 12/2003 | Kanemoto et al. | |
| 2011/0233741 | A1 | 9/2011 | Ishii et al. | |
| 2011/0316134 | A1 | 12/2011 | Ishii et al. | |
| 2012/0049378 | A1 | 3/2012 | Asada et al. | |

FOREIGN PATENT DOCUMENTS

| EP | 0 813 166 A2 | 12/1997 |
|---|---|---|
| JP | 9-327990 | 12/1997 |
| JP | 2004-13738 | 1/2004 |

* cited by examiner

*Primary Examiner* — Roy Potter
(74) *Attorney, Agent, or Firm* — Oblon, Spivak, McClelland, Maier & Neustadt, L.L.P.

(57) ABSTRACT

In an embodiment, a semiconductor memory card includes a lead frame including external connection terminals, a lead portion, a chip component mounting portion and a semiconductor chip mounting portion, a chip component mounted on the chip component mounting portion, a memory chip disposed on the semiconductor chip mounting portion, and a controller chip. A rewiring layer is formed on a surface of the memory chip. The lead frame is resin-sealed. An electric circuit of the controller chip and the memory chip on the lead frame is formed by the lead portion, the rewiring layer and a metal wire connected to electrode pad of the chips, the lead portion, and the rewiring layer.

20 Claims, 12 Drawing Sheets

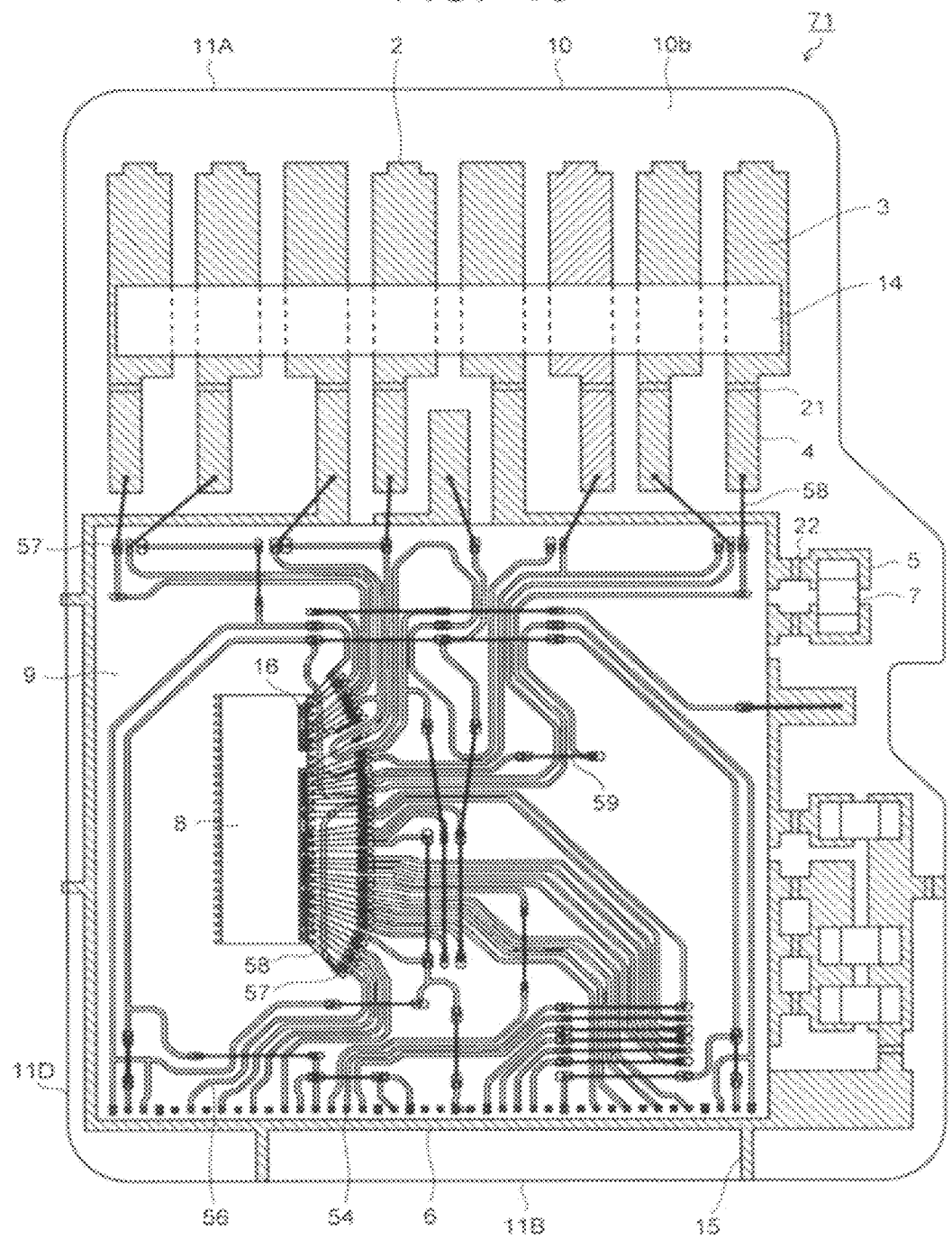

SEMICONDUCTOR MEMORY CARD

CROSS-REFERENCE TO RELATED APPLICATION

This application is based upon and claims the benefit of priority from Japanese Patent Applications No. 2011-065473, filed on Mar. 24, 2011, and No. 2011-242191, filed on Nov. 4, 2011; the entire contents of which are incorporated herein by reference.

FIELD

Embodiments described herein relate generally to a semiconductor memory card.

BACKGROUND

A semiconductor memory card having a NAND-type flash memory or the like built therein is being downsized while having larger capacity. In order to realize the reduction in cost of the semiconductor memory card, it has been studied to mount semiconductor chips such as a memory chip and a controller chip that constitute the semiconductor memory card on a lead frame having external connection terminals. On the lead frame, chip components such as a capacitor and a fuse, in addition to the semiconductor chips, are mounted. In the semiconductor memory card using the lead frame, the entire lead frame except surfaces of the external connection terminals is resin-sealed together with the semiconductor chips and the chip components.

When the lead frame is applied as a circuit substrate for the semiconductor memory card, there is a worry that a problem based on a structure of the lead frame arises. For example, the lead frame has a limitation in a formation of circuit compared with a wiring board, so that it may be difficult to form a circuit of the memory chip and the controller chip only by the lead frame and bonding wires. Further, although a thickness of the semiconductor memory card is specified by various standards, heights of the semiconductor chip and the chip component are not uniform, and the height of the chip component is generally higher than that of the semiconductor chip. When the lead frame is resin-sealed together with the semiconductor chips and the chip components under such a condition, a covering property of a sealing resin layer with respect to the chip components may be lowered, or a warpage of the semiconductor memory card and a positional displacement of the lead frame may occur at the time of performing resin sealing.

BRIEF DESCRIPTION OF THE DRAWINGS

FIG. 16 is a transparent top view showing a semiconductor memory card according to a fifth embodiment.

DETAILED DESCRIPTION

According to one embodiment, there is provided a semiconductor memory card including a lead frame, a memory chip, a controller chip, and a sealing resin layer sealing chip components, the memory chip, the controller chip and the lead frame. The lead frame includes a plurality of external connection terminals, a lead portion having a plurality of leads, a chip component mounting portion provided to the lead portion, and a semiconductor chip mounting portion. At least part of the leads is connected to the external connection terminals. The chip component is mounted on the chip component mounting portion of the lead frame, and is electrically connected to the lead portion. The memory chip has a chip body, first electrode pads formed on the chip body, an insulating resin film formed to cover a surface of the chip body while exposing the first electrode pads, and a rewiring layer formed on the insulating resin film. The controller chip has second electrode pads. An electric circuit of the memory chip and the controller chip on the lead frame is formed by the leads, the rewiring layer, and metal wires connected to at least one selected from the first electrode pad, the second electrode pad, the lead and the rewiring layer.

First Embodiment

Figure 1:
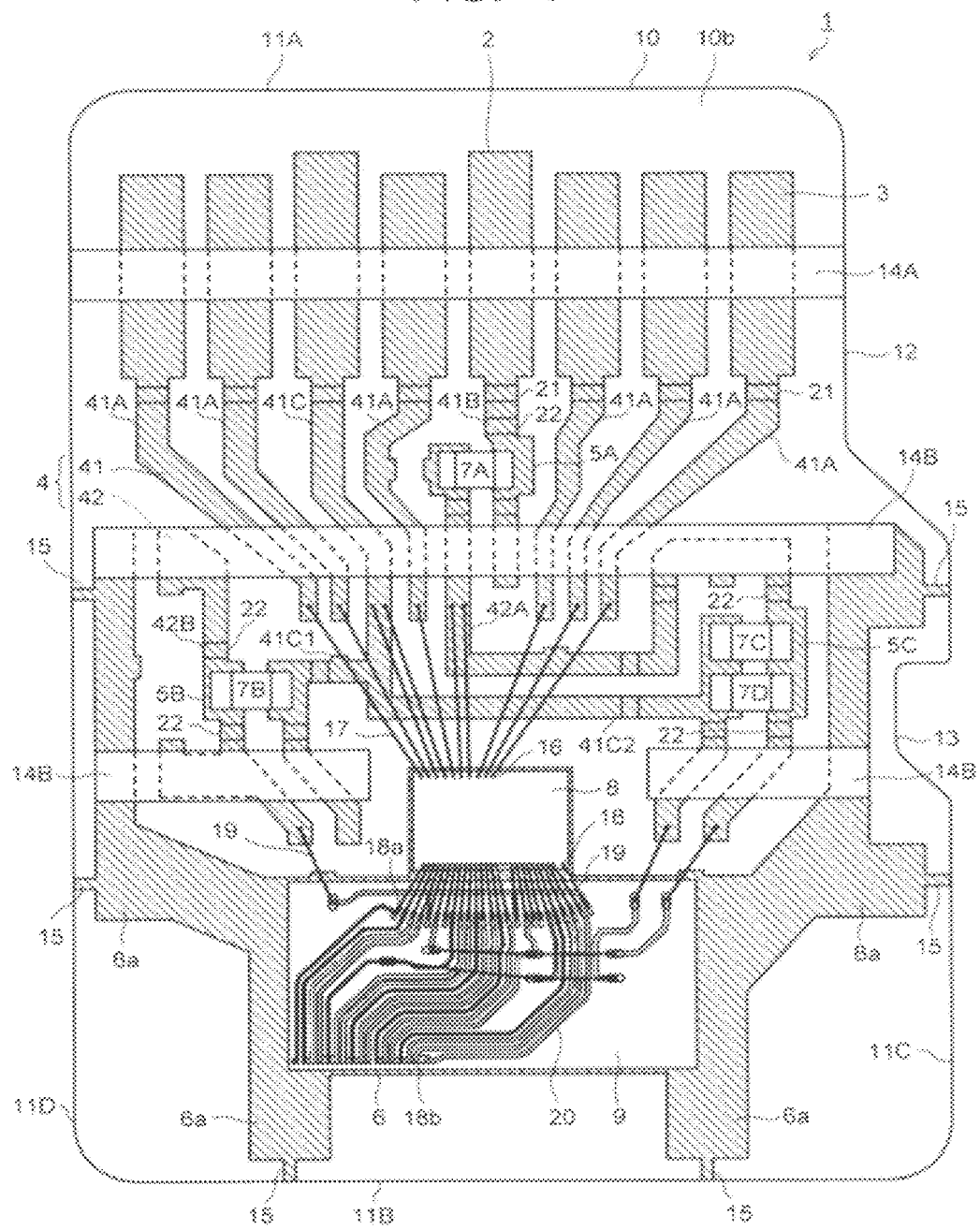
FIG. 1 is a transparent top view showing a semiconductor memory card according to a first embodiment.
Figure 2:
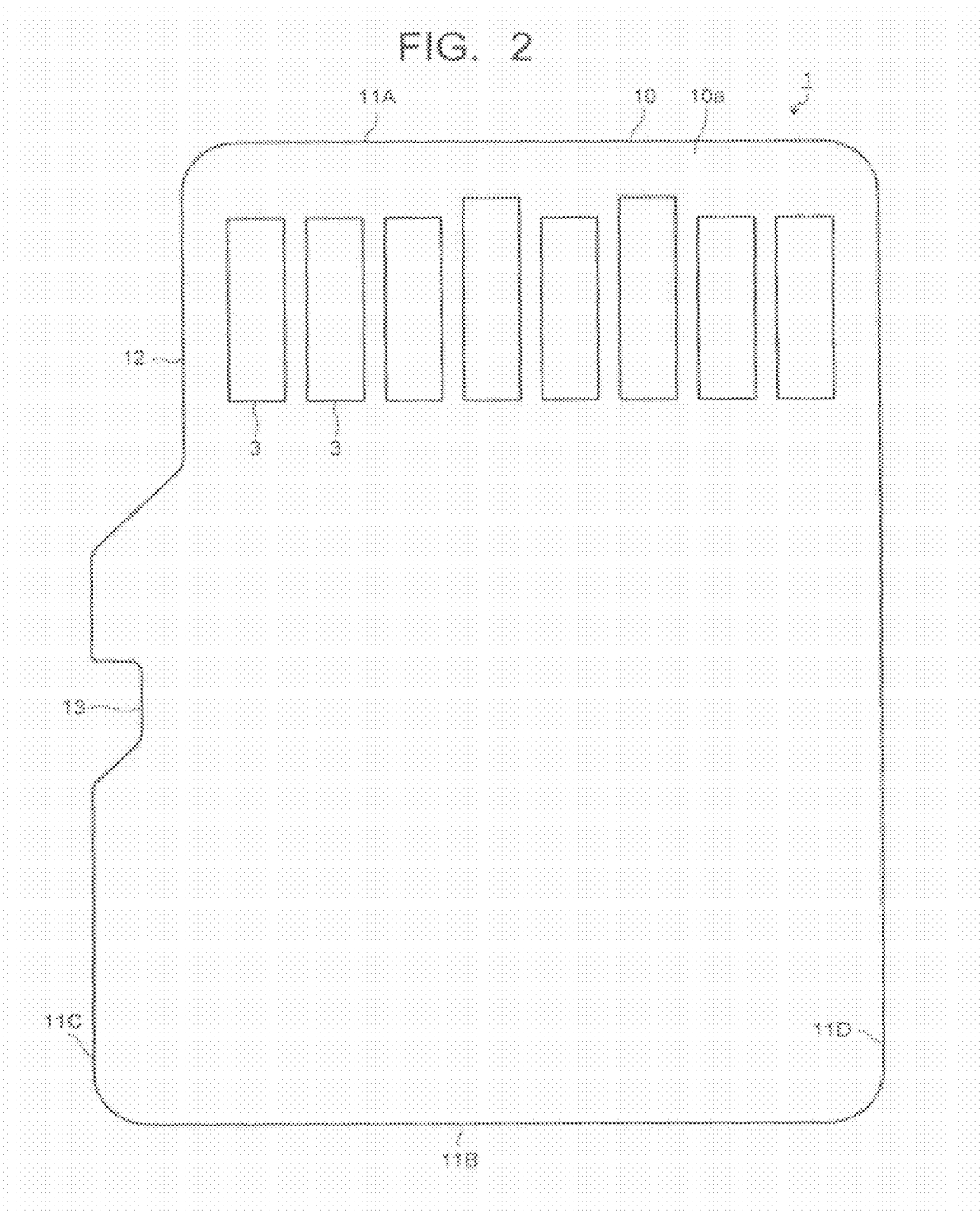
FIG. 2 is a bottom view of the semiconductor memory card shown in FIG. 1.
Figure 3:
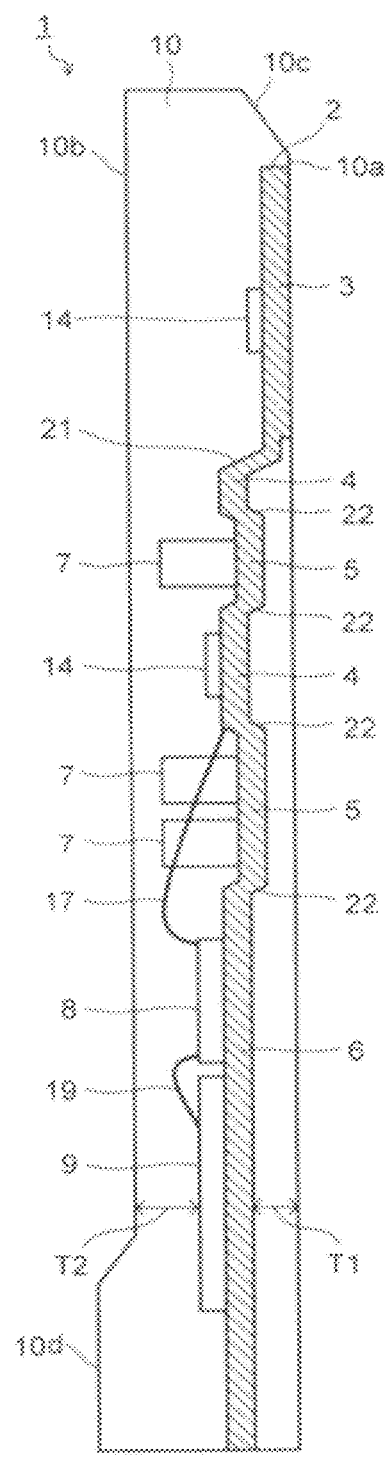
FIG. 3 is a sectional view of the semiconductor memory card shown in FIG. 1.

FIG. 1 to FIG. 3 are views showing a semiconductor memory card according to a first embodiment. FIG. 1 is a top view of the semiconductor memory card according to the first embodiment, and is a view showing a configuration of the semiconductor memory card in a transparent manner (transparent top view). FIG. 2 is a bottom view of the semiconductor memory card according to the first embodiment. FIG. 3 is a sectional view in which the semiconductor memory card according to the first embodiment is cut in a long edge direction (direction in which the card is inserted into a card slot). A semiconductor memory card 1 shown in these drawings is used as a memory card conforming to various standards.

The memory card 1 includes a lead frame 2 as a lead circuit member that serves as all of a terminal member, a wiring member and an element mounting member. The lead frame 2 includes a plurality of external connection terminals 3, a lead portion 4 having a plurality of leads, chip component mounting portions 5 provided to the lead portion 4, and a semiconductor chip mounting portion 6. At least some of the plural leads are connected to the external connection terminals 3. On the chip component mounting portions 5, chip components (passive components) 7 are mounted. On the semiconductor chip mounting portion 6, a controller chip 8 and a memory chip 9 such as a NAND-type flash memory are disposed. The controller chip 8 is a semiconductor chip that performs writing of data into the memory chip 9, and reading of data stored in the memory chip 9.

The lead frame 2 is sealed by a sealing resin layer 10. The sealing resin layer 10 is formed by transfer-molding a sealing resin such as epoxy resin so as to seal the lead frame 2 together with the chip components 7, the controller chip 8, and the memory chip 9, while exposing surfaces of the external connection terminals 3. The sealing resin layer 10 has an approximately rectangular outer shape, and forms an entire shape of the memory card 1. A first surface 10a of the sealing resin layer 10 to which the external connection terminals 3 are exposed (FIG. 2) corresponds to a rear surface of the memory card 1. A second surface 10b on a side opposite to the first surface 10a of the sealing resin layer 10 (FIG. 1) corresponds to a front surface of the memory card 1.

A first short edge 11A close to the external connection terminals 3 among outer edges 11 of the sealing resin layer 10 corresponds to a tip portion of the memory card 1. An inclined portion 10c indicating a frontward of the memory card 1 is provided at a tip portion of the sealing resin layer 10. A second short edge 11B of the sealing resin layer 10 corresponds to a rear portion of the memory card 1. A handle portion 10d formed by mounding a part of the sealing resin layer on the second surface 10b side is provided at a rear portion of the sealing resin layer 10. A cut-out portion 12 and a constricted portion 13 are formed at a first long edge 11C of the sealing resin layer 10 so as to indicate directions of front-and-rear and obverse-and-reverse of the memory card 1. A second long edge 11D of the sealing resin layer 10 is formed in a shape of straight line.

Each of tip portions of the plurality of external connection terminals 3 is disposed inside the sealing resin layer 10. No hanging lead is provided to the tip portion of the external connection terminal 3. Accordingly, the hanging lead is prevented from remaining at the tip potion of the sealing resin layer 10. When the hanging lead exists at the tip portion of the sealing resin layer 10, it may become an obstruction when the memory card 1 is inserted into the card slot or may damage the card slot. However, since the plurality of external connection terminals 3 are separated from a not-shown frame, a fixing tape 14A is adhered onto the terminals. The plurality of external connection terminals 3 are held by the fixing tape 14A.

The lead portion 4 has leads 41 directly connected to the external connection terminals 3, and leads 42 electrically independent of the external connection terminals 3. Out of these leads 41, 42, one end portion of each of first, second and third leads 41A, 41B and 41C is directly connected to the external connection terminals 3. The other end portion of each of the first leads 41A is disposed in an area in the vicinity of the controller chip 8. To each of the second lead 41B and a fourth lead 42A electrically independent of the second lead 41B, a first chip component mounting portion 5A is provided. On the first chip component mounting portion 5A, a first chip component 7A such as a fuse is mounted while being electrically connected to the second and the fourth lead 41B, 42A. The fourth lead 42A is led around to the vicinity of the memory chip 9 via the area in the vicinity of the controller chip 8.

The third lead 41C is led around the area in the vicinity of the controller chip 8, and is then branched. To each of one branch portion 41C1 of the third lead 41C and a fifth lead 42B electrically independent of the branch portion 41C1, a second chip component mounting portion 5B is provided. On the second chip component mounting portion 5B, a second chip component 7B such as a capacitor is mounted while being electrically connected to the branch portion 41C1 of the third lead 41C and the fifth lead 42B. The fifth lead 42B is led around to the vicinity of the memory chip 9.

The other branch portion 41C2 of the third lead 41C is led around to the vicinity of the memory chip 9, similar to the fourth lead 42A. To the branch portion 41C2 of the third lead 41C and the fourth lead 42A, a third chip component mounting portion 5C is provided. On the third chip component mounting portion 5C, third and fourth chip components 7C, 7D such as capacitors are mounted while being electrically connected to the branch portion 41C2 of the third lead 41C and the fourth lead 42A. The branch portion 41C2 of the third lead 41C and the fourth lead 42A are led around to the vicinity of the memory chip 9 via a formation position of the third chip component mounting portion 5C.

The semiconductor chip mounting portion 6 is extended toward the short edge 11B and the both long edges 11C, 11D of the sealing resin layer 10. To these extended portions 6a, hanging leads 15 connected to the not-shown frame are respectively provided. The semiconductor chip mounting portion 6 is supported by the hanging leads 15. The leads 41A, 41B, 41C, 42A, 42B are separated from the frame. These leads are held by a fixing tape 14B adhered to the extended portions 6a provided with the hanging leads 15. The fixing tape 14B is adhered from the extended portions 6a toward the leads 41A, 41B, 41C, 42A, 42B, and fixes these leads to the extended portions 6a supported by the hanging leads 15.

Each of the controller chip 8 and the memory chip 9 disposed on the semiconductor chip mounting portion 6 has a rectangular outer shape. The controller chip 8 is disposed between the external connection terminals 3 and the memory chip 9. The controller chip 8 is disposed on a side closer to the external connection terminals 3 than the memory chip 9. The controller chip 8 has electrode pads 16 arranged along both long edges thereof. The electrode pads 16 arranged along one long edge of the controller chip 8 are electrically connected to the first, third and fourth leads 41A, 41C and 42A via first metal wires 17.

The memory chip 9 has connection pads 18a arranged along its long edge on a side close to the controller chip 8. The connection pads 18a of the memory chip 9 are electrically connected to the electrode pads 16 arranged along the other long edge of the controller chip 8 via second metal wires 19. Some of the connection pads 18a of the memory chip 9 are electrically connected to the third, fourth and fifth leads 41C, 42A and 42B via the second metal wires 19. On a surface of the memory chip 9, a rewiring layer 20 is provided. Electrode pads 18b arranged along a long edge on a side far from the controller chip 8 are led around to the connection pads 18a arranged along the long edge on the side close to the controller chip 8 by the rewiring layer 20.

Out of the respective portions that form the lead frame 2, the external connection terminals 3 are exposed to the first surface (rear surface) 10a of the sealing resin layer 10. The lead portion 4 connected to the external connection terminals 3, the semiconductor chip mounting portion 6 and the like are embedded into the sealing resin layer 10. For this reason, the lead frame 2 has first processed portions 21 each formed by bending connection portions between the external connection terminals 3 and the lead portion 4, as shown in FIG. 3. The first processed portions 21 are provided so as to dispose the lead portion 4 and the semiconductor chip mounting portion 6 inside the sealing resin layer 10 while exposing the external connection terminals 3 to the outside. Each of the first processed portions 21 is formed by bending the connection portions between the external connection terminals 3 and the lead portion 4 while reducing a thickness of the connection portion with the use of coining and the like, so that only the external connection terminals 3 are exposed to the outside.

A processed height of the lead frame 2 based on the first processed portions 21, namely, a height obtained by once bending the connection portions between the external connection terminals 3 and the lead portion 4 upward and then bending them back in the horizontal direction, is basically decided in accordance with a set position of the semiconductor chip mounting portion 6 at the time of resin-sealing the lead frame 2. The position of the semiconductor chip mounting portion 6 in a mold for resin sealing is set so that a resin thickness T1 of the sealing resin layer 10 from the semiconductor chip mounting portion 6 to the first surface 10a and a resin thickness T2 from upper surfaces of the controller chip 8 and the memory chip 9 to the second surface 10b become approximately equal to each other. This is because, when a difference between the resin thickness T1 and the resin thickness T2 is large, a positional displacement of the semiconductor chip mounting portion 6 (so-called bed shift) is likely to occur in a resin sealing process performed through transfer molding, and the sealing resin layer 10 is likely to be warped after performing the resin sealing.

Figure 4:
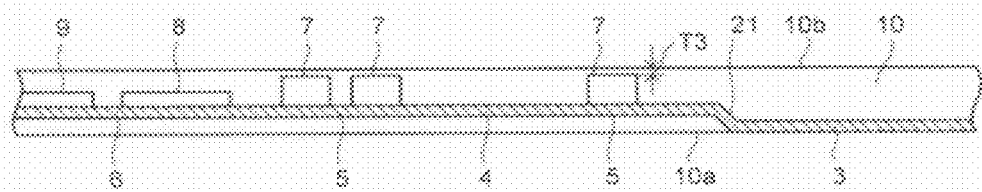
FIG. 4 is a view showing a cross-sectional configuration of a lead frame in a semiconductor memory card of a first comparative example.
Figure 5:
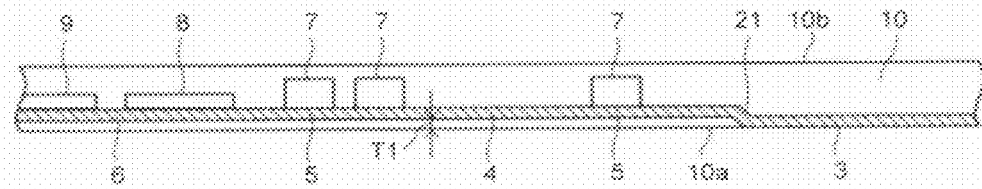
FIG. 5 is a view showing a cross-sectional configuration of a lead frame in a semiconductor memory card of a second comparative example.
Figure 6:
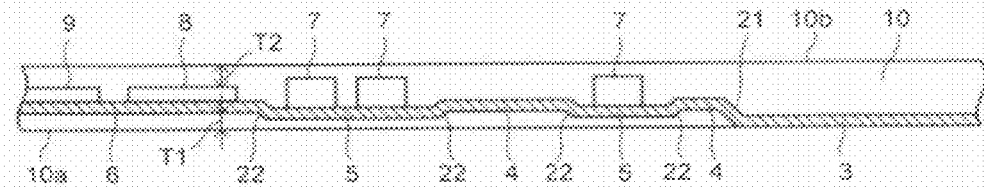
FIG. 6 is a view showing a cross-sectional configuration of a lead frame in the semiconductor memory card of the first embodiment.

A height of the chip component 7 is generally higher than that of the controller chip 8 and the memory chip 9. For this reason, as shown in FIG. 4, when a height of the chip component mounting portions 5 (height from the first surface 10a of the sealing resin layer 10) is set to be equal to a height of the semiconductor chip mounting portion 6, a resin thickness T3 of the sealing resin layer 10 from each of the chip components 7 to the second surface 10b becomes small. A covering property of the sealing resin layer 10 with respect to the chip components 7 is lowered, and according to circumstances, there arises a possibility that the chip components 7 are exposed to the outside. Meanwhile, as shown in FIG. 5, when the height of the chip component mounting portions 5 capable of sufficiently covering the chip components 7 is set as a reference, and the height of the semiconductor chip mounting portion 6 is aligned with the height of the chip component mounting portions 5, the resin thickness T1 of the sealing resin layer 10 from the semiconductor chip mounting portion 6 to the first surface 10a becomes small. A covering property with respect to the lead frame 2 is likely to be lowered, and the positional displacement of the semiconductor chip mounting portion 6 and the warpage of the sealing resin layer 10 in the resin sealing process as described above become likely to occur.

In order to suppress the occurrence of poor covering of the chip components 7 or the occurrence of the positional displacement and the warpage in the resin sealing process, in this embodiment, the height of the semiconductor chip mounting portion 6 (height from the first surface 10a of the sealing resin layer 10) is set so that the resin thickness T1 of the sealing resin layer 10 from the semiconductor chip mounting portion 6 to the first surface 10a and the resin thickness T2 from the upper surfaces of the controller chip 8 and the memory chip 9 to the second surface 10b become approximately equal to each other, and then the chip component mounting portions 5 are disposed at a position closer to the first surface 10a of the sealing resin layer 10 than the semiconductor chip mounting portion 6. In order to realize such a structure, the lead frame 2 has second processed portions 22 formed by bending the connection portions between the lead portion 4 and the chip component mounting portions 5.

The second processed portions 22 are formed by bending the connection portions between the lead portion 4 and the chip component mounting portions 5 so that the chip component mounting portions 5 are disposed at the position closer to the first surface 10a of the sealing resin layer 10 than the semiconductor chip mounting portion 6. By providing the second processed portions 22, it is possible to dispose the chip component mounting portions 5 at a position at which the chip components 7 can be sufficiently covered by the sealing resin layer 10, while disposing the semiconductor chip mounting portion 6 at a position at which the resin thickness T1 and the resin thickness T2 become approximately equal to each other. Therefore, the reduction in the covering property with respect to the chip components 7 and the exposure of the chip components 7 to the outside along with the reduction in the covering property are prevented, and in addition to that, it becomes possible to suppress the occurrence of the positional displacement of the semiconductor chip mounting portion 6 and the warpage of the sealing resin layer 10 in the resin sealing process. According to these structures, it is possible to increase manufacturability and reliability of the memory card 1 using the lead frame 2.

The second processed portions 22 are provided so that only the areas on which the chip component mounting portions 5 (including peripheral areas of the areas, in some cases) are disposed at the position closer to the first surface 10a of the sealing resin layer 10 than the semiconductor chip mounting portion 6. By applying the second processed portions 22, an area of the lead portion 4 except the areas on which the chip component mounting portions 5 are provided (including the peripheral areas of the areas, in some cases) is disposed at the same height as that of the semiconductor chip mounting portion 6. The lead portion 4 and the semiconductor chip mounting portion 6 except the chip component mounting portions 5 or the chip component mounting portions 5 and their peripheral areas whose height is set by the second processed portions 22, are disposed at a height set by the first processed portions 21.

If explanation is made by citing the second lead 41B as an example, the first processed portion 21 is provided at the connection portion between the second lead 41B and the external connection terminal 3. A height of the second lead 41B is set to be equal to that of the semiconductor chip mounting portion 6 by the first processed portion 21. The second processed portions 22 are provided at the connection portions between the second lead 41B and one end of the chip component mounting portion 5A and between the second lead 41B and the other end of the chip component mounting portion 5A. With the use of these second processed portions 22, the chip component mounting portion 5A is disposed at a predetermined height, and the second lead 41B is bent back to the height of the semiconductor chip mounting portion 6. The third, fourth and fifth leads 41C, 42A and 42B to which the chip component mounting portions 5A, 5B, 5C are provided also have a similar configuration.

The third lead 41C is set to have the same height as that of the semiconductor chip mounting portion 6 with the use of the first processed portion 21 provided at the connection portion between the third lead 41C and the external connection terminal 3. The third lead 41C is bent back to the height of the semiconductor chip mounting portion 6 while disposing the chip component mounting portions 5B, 5C at the predetermined height with the use of the second processed portions 22 provided at the connection portions between the third lead 41C and the chip component mounting portion 5B and between the third lead 41C and the chip component mounting portion 5C. The fourth and fifth leads 42A and 42B are disposed at the height of the semiconductor chip mounting portion 6, and the chip component mounting portions 5B, 5C and their peripheral areas are disposed at the predetermined height with the use of the second processed portions 22. Regarding the fourth lead 42A, a peripheral area of the chip component mounting portion 5C is also subjected to bending with the use of the second processed portions 22. This is a result of performing bending on a portion close to the chip component mounting portion 5C, as a matter of convenience of metal molding.

By disposing the area of the lead portion 4 except for the areas on which the chip component mounting portions 5 are provided and their peripheral areas at the same height as that of the semiconductor chip mounting portion 6, when each of the leads 41A to 41C, 42A and 42B of the lead portion 4 and the controller chip 8 and the memory chip 9 are wire-bonded, it is possible to suppress a reduction in wire bonding property and an occurrence of bonding failure due to the variation in height of the lead portion 4. Further, it is possible to enhance a holding property of the aforementioned fixing tape 14B with respect to the lead portion 4.

The fixing tape 14B is adhered from the extended portions 6a of the semiconductor chip mounting portion 6 toward the leads 41A, 41B, 41C, 42A, 42B. A portion of each lead to which the fixing tape 14B is adhered is disposed at the same height as that of the semiconductor chip mounting portion 6. The fixing tape 14B is adhered to an area of each lead disposed at the same height as that of the semiconductor chip mounting portion 6. Therefore, an adhesion property of the fixing tape 14B with respect to the extended portions 6a and each lead is improved, and further, it becomes possible to enhance a holding property of the fixing tape 14B with respect to the respective leads 41, 42.

Second Embodiment

Figure 7:
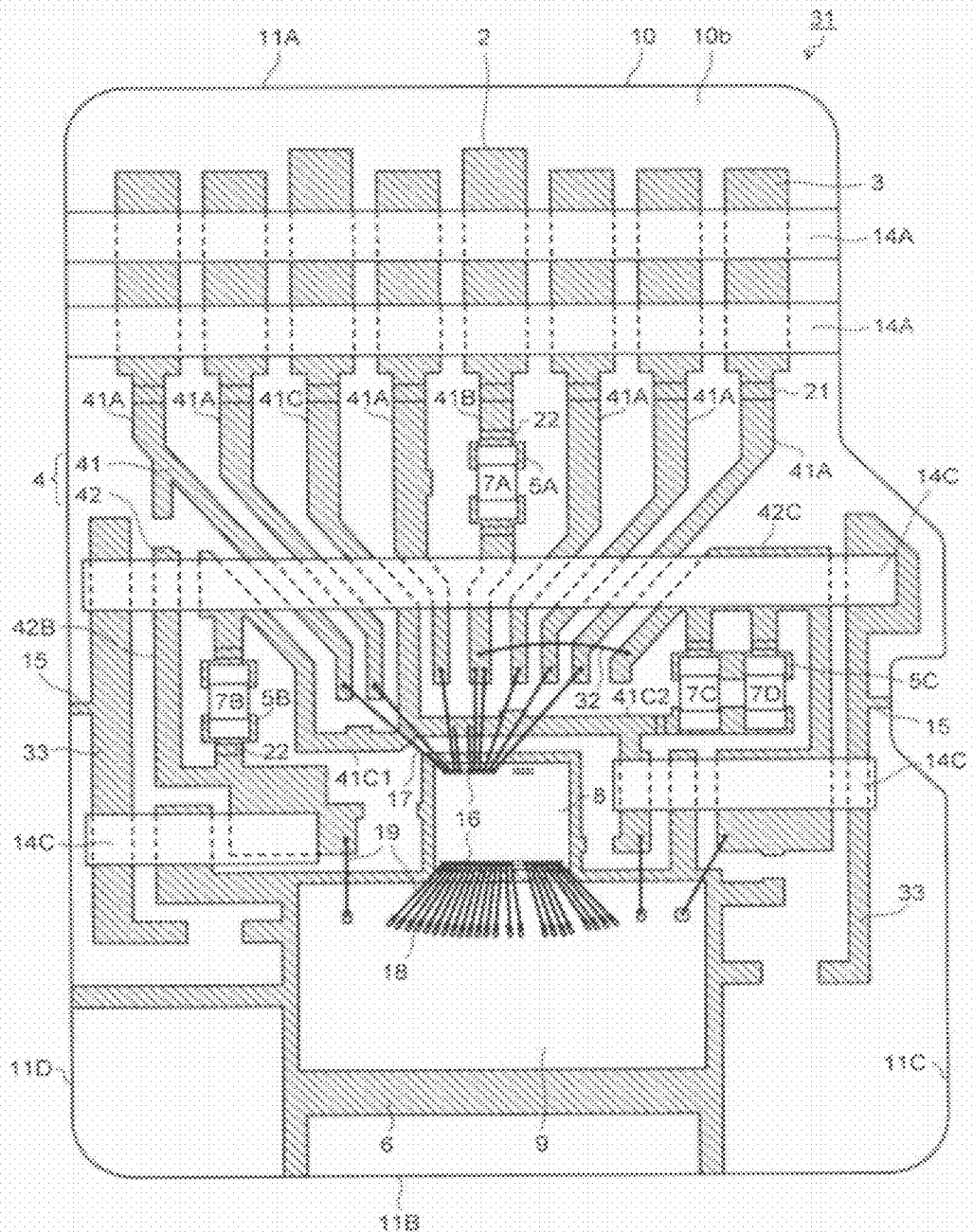
FIG. 7 is a transparent top view showing a semiconductor memory card according to a second embodiment.

Next, a memory card according to a second embodiment will be described with reference to FIG. 7. The same portions as those of the first embodiment are denoted by the same reference numerals, and a part of explanation thereof will be omitted. In a memory card 31 shown in FIG. 7, it is set that the configurations of the lead portion 4 and the chip component mounting potions 5 are basically the same as those of the memory card 1 according to the first embodiment. The second lead 41B is led around to the area in the vicinity of the controller chip 8 via the first chip component mounting portion 5A. The second lead 41B is electrically connected to a sixth lead 42C provided with the third chip component mounting portion 5C via a third metal wire 32.

In the memory card 31 according to the second embodiment, the lead frame 2 has fixing portions 33 provided along the both long edges 11C, 11D of the sealing resin layer 10. To the fixing portions 33, the hanging leads 15 are provided. The semiconductor chip mounting portion 6 is electrically independent of the fixing portions 33. The semiconductor chip mounting portion 6 is held by fixing tapes 14C adhered to the fixing portions 33 provided with the hanging leads 15. The fixing tapes 14C are adhered from the fixing portions 33 toward a part of each of the semiconductor chip mounting portion 6 and the lead portion 4, and fixes a part of each of the semiconductor chip mounting portion 6 and the lead portion 4 to the fixing portions 33 supported by the hanging leads 15.

The semiconductor chip mounting portion 6 in the second embodiment is electrically independent between both sides having the long edges 11C, 11D of the sealing resin layer 10. The semiconductor chip mounting portion 6 is not conducted through the hanging leads 15 provided to the both sides of the sealing resin layer 10. A portion between the hanging leads 15 provided to the both sides of the sealing resin layer 10 is electrically independent inside the sealing resin layer 10. By applying the semiconductor chip mounting portion 6 as above, even in a case where the both side surfaces of the sealing resin layer 10 are brought into contact with an external conduction member or the like, there is no chance that the semiconductor chip mounting portion 6 is short-circuited. Therefore, even in a case where a portion between the both side surfaces of the sealing resin layer 10 is short-circuited, a short-circuit failure of the controller chip 8 and the memory chip 9 is suppressed, which enables to enhance reliability of the memory card 31.

Third Embodiment

Next, a memory card according to a third embodiment will be described with reference to FIG. 8. Similar to the first and second embodiments, a memory card 51 shown in FIG. 8 includes the lead frame 2 having the external connection terminals 3, the lead portion 4, the chip component mounting portions 5, the semiconductor chip mounting portion 6 and the like, the chip components (passive components) 7 mounted on the chip component mounting portions 5, and the controller chip 8 and the memory chip 9 disposed on the semiconductor chip mounting portion 6. The lead frame 2 that forms the memory card 51 has the same shape as that of the lead frame 2 of the second embodiment. A basic configuration of the memory card 51 is similar to that of the first and second embodiments. An effect based on the same configuration is provided, similar to the first and second embodiments. Portions denoted by the same reference numerals as those of the first and second embodiments are the same portions, and a part of explanation thereof will be omitted.

Each of the controller chip 8 and the memory chip 9 disposed on the semiconductor chip mounting portion 6 has a rectangular outer shape. The controller chip 8 is disposed between the external connection terminals 3 and the memory chip 9. The controller chip 8 has electrode pads 16A arranged along the long edge on the side close to the external connection terminals 3, and electrode pads 16B arranged along the long edge on the side close to the memory chip 9. The electrode pads 16A of the controller chip 8 are electrically connected to the first, second and third leads 41A, 41B and 41C via metal wires 52.

Figure 9:
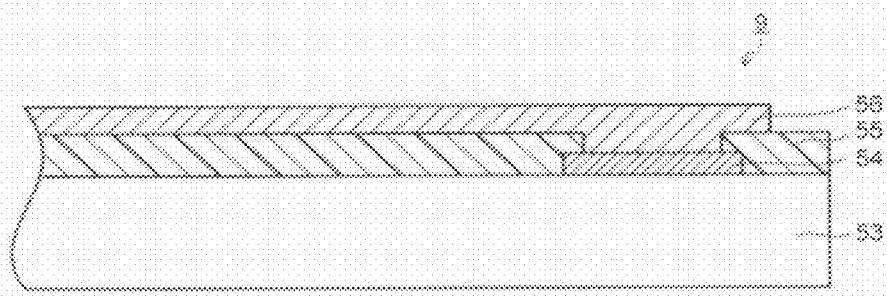
FIG. 9 is a sectional view showing a first configuration example of a rewiring layer of a memory chip in the semiconductor memory card shown in FIG. 8.

As shown in FIG. 9, the memory chip 9 has a chip body 53 having a semiconductor element portion whose illustration is omitted, electrode pads 54 formed on the chip body 53, an insulating resin film 55 formed to cover a surface of the chip body 53 while exposing the electrode pads 54, and a rewiring layer 56 formed on the insulating resin film 55. Depending on the arrangement and the type of the electrode pads 16, 54 of the controller chip 8 and the memory chip 9, there arises a necessity of relocating the electrode pad 54 of the memory chip 9. The rewiring layer 56 provided on the insulating resin film (protective film) 55 made of polyimide resin or the like is for relocating the electrode pad 54 at a desired position on the memory chip 9. For example, one end portion of the rewiring layer 56 is electrically connected to the electrode pad 54, and the other end portion thereof has a connection pad 57 to be bonding portion of the metal wire.

In consideration of a bonding property of the metal wire with respect to the rewiring layer 56, at least an uppermost layer of the rewiring layer 56 is preferably formed of Al, an Al alloy such as Al-0.5 mass % Cu alloy, or a noble metal material such as Au and Pd. Further, when a formability and an adhesiveness of the rewiring layer 56 with respect to an upper portion of the insulating resin film 55 are taken into consideration, a lowermost layer of the rewiring layer 56 is preferably formed of Ti, Cr or the like. As a concrete configuration of the rewiring layer 56, there can be cited a stacked film such as an Al/Ti stacked film and an Au/Ni/Cu/Ti stacked film. When the rewiring layer 56 is formed of a stacked film having an uppermost layer formed of an Al layer (including an Al alloy layer), a thickness of the uppermost layer is preferably set to 2 µm or more for securing the bonding property. Even when the thickness of the uppermost layer is increased too much, no further effect can be obtained, so that the thickness of the uppermost layer is preferably set to 5 µm or less.

Figure 8:
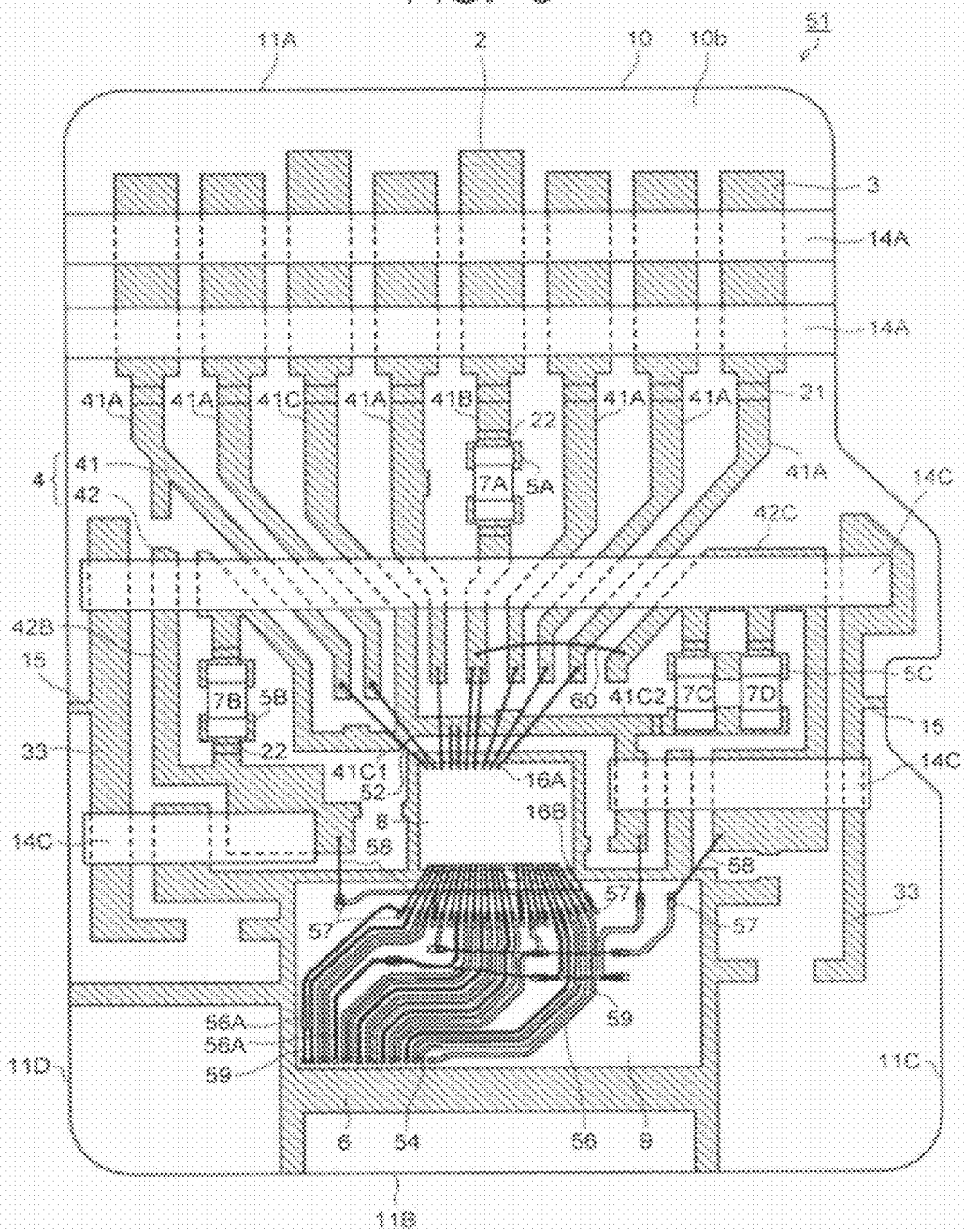
FIG. 8 is a transparent top view showing a semiconductor memory card according to a third embodiment.

In a plurality of rewires that configure the rewiring layer 56, one end portions of at least some of rewires 56A are electrically connected to the electrode pads 54, and the connection pads 57 are formed on the other end portions, as shown in FIG. 8. To the connection pads 57 formed on the end portions of the rewires 56A, one end portions of metal wires 58 are bonded. The other end portions of the metal wires 58 are bonded to the electrode pads 16B of the controller chip 8 and the leads 41C, 42B, 42C. The rewires 56A are electrically connected to the electrode pads 16B of the controller chip 8 and the leads 41C, 42B, 42C via the metal wires 58.

Figure 10:
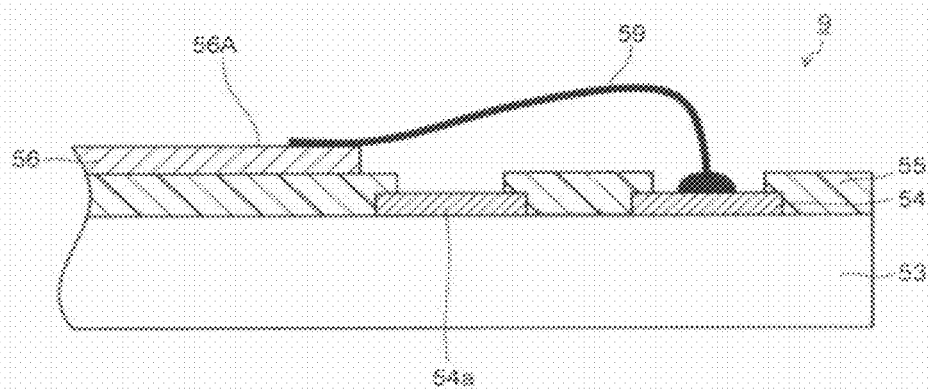
FIG. 10 is a sectional view showing a second configuration example of the rewiring layer of the memory chip in the semiconductor memory card shown in FIG. 8.
Figure 11:
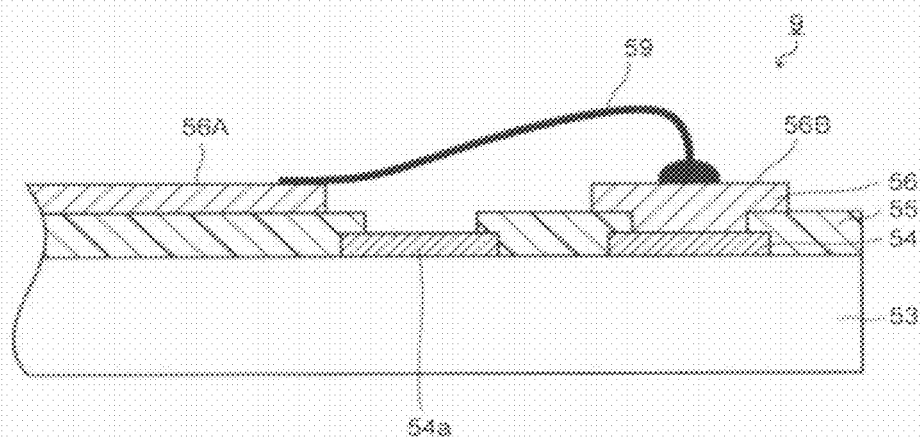
FIG. 11 is a sectional view showing a modified example of the rewiring layer shown in FIG. 10.

An electrical connecting structure between the rewire 56A and the electrode pad 54 may employ a structure in which they are directly connected to each other as shown in FIG. 9, or may also employ a structure in which they are connected via a metal wire 59 as shown in FIG. 10 and FIG. 11. For example, in such a case where there exists an electrode pad 54a or the like having a different electric potential in the vicinity of the electrode pad 54 to which the rewire 56A is connected, the metal wire 59 is disposed so as to step over the electrode pad 54a having the different electric potential, as shown in FIG. 10 and FIG. 11. Accordingly, it is possible to connect the rewire 56A to the electrode pad 54 without causing a circuit failure due to the electrode pad 54a having the different electric potential. The metal wire 59 may be directly bonded to the electrode pad 54 as shown in FIG. 10, and may also be bonded to a connection pad 56B formed of the rewiring layer 56 on the electrode pad 54 as shown in FIG. 11.

Figure 12:
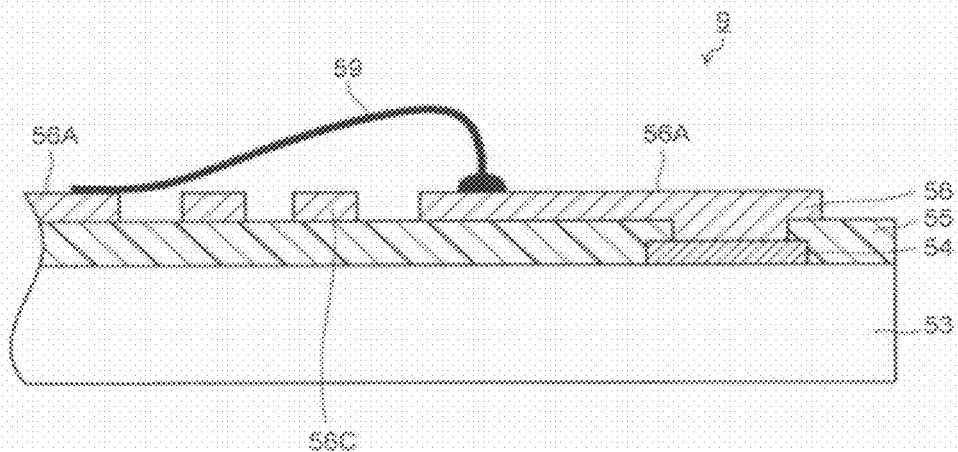
FIG. 12 is a sectional view showing a third configuration example of the rewiring layer of the memory chip in the semiconductor memory card shown in FIG. 8.

The step-over structure with the use of the metal wire 59 is not limited to the structure of striding over the electrode pad 54a having the different electric potential, and is also effective for a structure of striding over a rewire having a different electric potential. When, as shown in FIG. 12, there exists a rewire 56C having a different electric potential at a position at which the rewire 56A is wanted to be disposed, the metal wire 59 is disposed so as to step over the rewire 56C having the different electric potential. Accordingly, it is possible to favorably connect between the rewires 56A having the same electric potential. By applying the step-over structure with the use of the metal wire 59, it is possible to enhance a formability of the circuit with the use of the rewiring layer 56. If the rewiring layer 56 is set to have a multilayer wiring structure, a similar circuit can be formed, but, in that case, a formation cost of the rewiring layer 56 is increased. For this reason, the rewiring layer 56 is preferably set to have a single-layer structure. By applying the step-over structure with the use of the metal wire 59, it is possible to form various circuits by using the rewiring layer 56 with the single-layer structure.

The step-over structure with the use of the metal wire 59 is effective not only for the rewiring layer 56 but also for the lead portion 4. The second lead 41B is electrically connected to the sixth lead 42C having the same electric potential via a metal wire 60 disposed so as to step over the first leads 41A having a different electric potential. By applying the step-over structure with the use of the metal wire 60, it is possible to enhance a formability of the circuit with the use of the lead portion 4. By combining the lead portion 4, the rewiring layer 56 and the metal wires 52, 59, 60, it is possible to easily form the electric circuit of the controller chip 8 and the memory chip 9 on the lead frame 2. By applying the step-over structure with the use of the metal wires 59, 60, the formability of the electric circuit is improved.

The memory card 51 according to the third embodiment also has the fixing portions 33 electrically independent of the semiconductor chip mounting portion 6 and provided with the hanging leads 15, similar to the second embodiment. The semiconductor chip mounting portion 6 is held by the fixing tapes 14C adhered to the fixing portions 33. The fixing tapes 14C are adhered from the fixing portions 33 toward a part of each of the semiconductor chip mounting portion 6 and the lead portion 4, and fixes a part of each of the semiconductor chip mounting portion 6 and the lead portion 4 to the fixing portions 33 supported by the hanging leads 15. By applying the semiconductor chip mounting portion 6 as above, even in a case where the both side surfaces of the sealing resin layer 10 are brought into contact with an external conduction member or the like, there is no chance that the semiconductor chip mounting portion 6 is short-circuited. It becomes possible to suppress an occurrence of failure of the controller chip 8 and the memory chip 9.

In the memory card 51 of the third embodiment, the electric circuit of the controller chip 8 and the memory chip 9 on the lead frame 2 is formed by the lead portion 4, the rewiring layer 56 and the metal wires 52, 59, 60. When compared with a case where the electric circuit of the controller chip 8 and the memory chip 9 is formed by using only the leads and the metal wires, it is possible to improve the formability of the electric circuit of the controller chip 8 and the memory chip 9 by applying the rewiring layer 56 as a component of the electric circuit. The reduction in cost of the memory card 51 is realized by using the lead frame 2, and in addition to that, it is possible to enhance the formability of the circuit of the controller chip 8 and the memory chip 9. The formability of the circuit when the controller chip 8 is mixedly mounted is improved. Therefore, it becomes possible to provide the memory card 51 excellent in practicability and reliability in an inexpensive manner.

Figure 13:
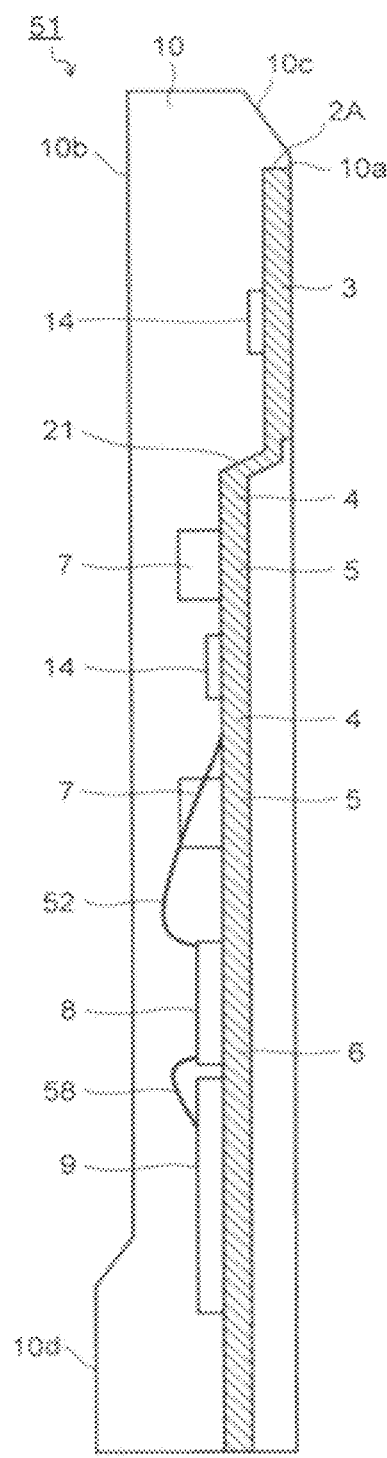
FIG. 13 is a sectional view showing a modified example of the semiconductor memory card shown in FIG. 8.

In the memory card 51 of the third embodiment, the lead frame 2 in which the second processed portions 22 are provided at the connection portions between the lead portion 4 and the chip component mounting portions 5 is applied, similar to the first and second embodiments. As shown in FIG. 13, it is possible to apply, depending on the shape of the chip components 7 and the formation position of the semiconductor chip mounting portion 6, a lead frame 2A having only the first processed portions 21 provided at the connection portions between the external connection terminals 3 and the lead portion 4. It is possible to apply the lead frame 2A which is flat except the external connection terminals 3.

Fourth Embodiment

Figure 14:
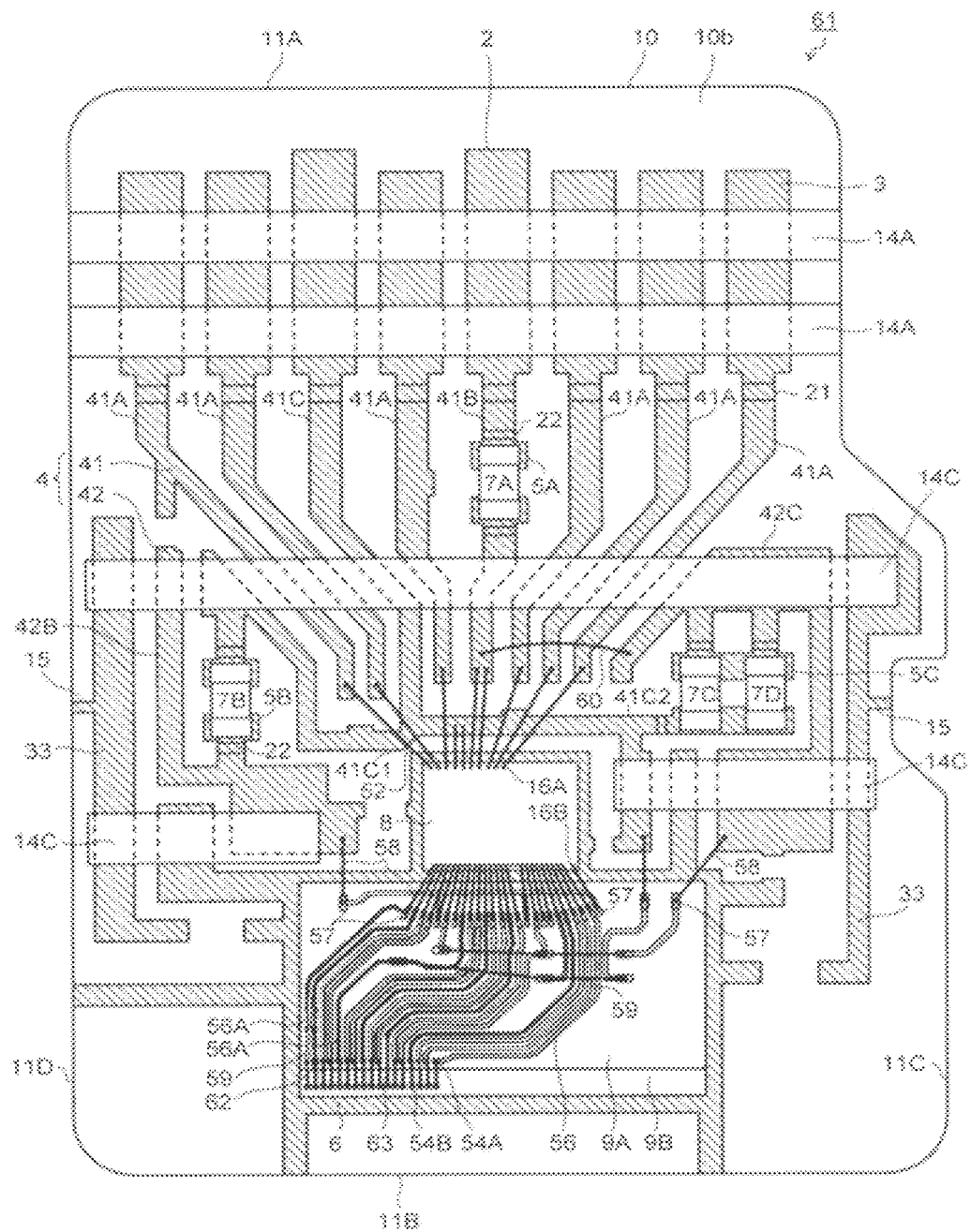
FIG. 14 is a transparent top view showing a semiconductor memory card according to a fourth embodiment.
Figure 15:
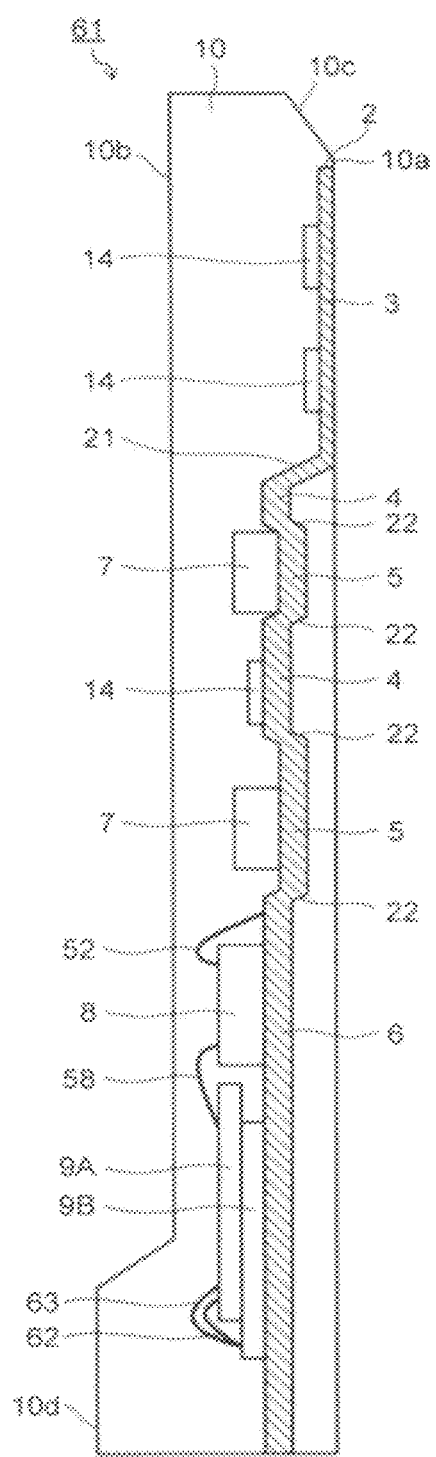
FIG. 15 is a sectional view of the semiconductor memory card shown in FIG. 14.

Next, a memory card according to a fourth embodiment will be described with reference to FIG. 14 and FIG. 15. The same portions as those of the third embodiment are denoted by the same reference numerals, and a part of explanation thereof will be omitted. A memory card 61 shown in FIG. 14 and FIG. 15 has a configuration similar to that of the third embodiment except that two memory chips 9A, 9B are stacked to be disposed on the semiconductor chip mounting portion 6. The configurations of the lead portion 4, the chip component mounting portions 5 and the semiconductor chip mounting portion 6 in the lead frame 2, the structure of mounting the chip components 7 on the chip component mounting portions 5, the structure of connecting the external connection terminals 3 and the controller chip 8, and the structure of holding the lead portion 4 and the semiconductor chip mounting portion 6 are similar to those of the third embodiment.

When the plurality of memory chips 9A, 9B are stacked to be disposed on the semiconductor chip mounting portion 6, the rewiring layer 56 is provided only on a surface of the memory chip 9A of the uppermost. Electrode pads 54A of the upper memory chip 9A are electrically connected to the electrode pads 16B of the controller chip 8 and the leads 41C, 42B, 42C via the rewiring layer 56 and the metal wires 58, similar to the third embodiment. The upper memory chip 9A is stacked in a stepped manner so that electrode pads 54B of the lower memory chip 9B are exposed. The electrode pads 54B of the lower memory chip 9B are electrically connected to the electrode pads 54A having the same electric potential of the upper memory chip 9A via metal wires 62. A terminal for element selection (chip select) (the electrode pad 54B) or the like is electrically connected to the rewiring layer 56 via a metal wire 63.

Also in the memory card 61 of the fourth embodiment, the electric circuit is formed by using the lead portion 4, the rewiring layer 56, the metal wires 52, 59, 60, 62, 63 and the like. Also in the case where the plurality of memory chips 9A, 9B are mounted on the lead frame 2, the formability of the circuit for the controller chip 8 and the memory chips 9A, 9B is improved. The reduction in cost of the memory card 61 is realized by using the lead frame 2, and in addition to that, it is possible to enhance the formability of the circuit of the controller chip 8 and the memory chips 9A, 9B. Therefore, it becomes possible to provide the memory card 61 excellent in practicability and reliability in an inexpensive manner. Here, the structure in which the two memory chips 9A, 9B are stacked was described, but, the same applies to a case where three or more of the memory chips 9 are stacked, in which the rewiring layer 56 is provided only on a surface of the memory chip 9 of the uppermost.

Fifth Embodiment

Next, a memory card according to a fifth embodiment will be described with reference to FIG. 16. The same portions as those of the first to third embodiments are denoted by the same reference numerals, and a part of explanation thereof will be omitted. A memory card 71 shown in FIG. 16 basically has a configuration similar to that of the memory card 51 according to the third embodiment except that the controller chip 8 is disposed on the memory chip 9. The lead frame 2 includes the plurality of external connection terminals 3, the lead portion 4 having the plurality of leads in which at least some of them are connected to the external connection terminals 3, the chip component mounting portions 5 provided to the lead portion 4, and the semiconductor chip mounting portion 6.

The lead frame 2 has the first processed portions 21 formed by bending the connection portions between the external connection terminals 3 and the lead portion 4. The first processed portions 21 are for disposing the lead portion 4 and the semiconductor chip mounting portion 6 inside the sealing resin layer 10 while exposing the external connection terminals 3 to the outside. The lead frame 2 has the second processed portions 22 formed by bending the connection portions between the lead portion 4 and the chip component mounting portions 5. The second processed portions 22 are formed by bending the connection portions so that the chip component mounting portions 5 are positioned closer to the first surface 10a of the sealing resin layer 10 than the semiconductor chip mounting portion 6.

On the chip component mounting portions 5, the chip components 7 are mounted. On the semiconductor chip mounting portion 6, the memory chip 9 is disposed. The controller chip 8 is disposed on the memory chip 9. On a surface of the memory chip 9, the rewiring layer 56 is formed, similar to the third embodiment. One end portions of the rewiring layer 56 are electrically connected to the electrode pads 54 of the memory chip 9. The other end portions of the rewiring layer 56 are electrically connected to the electrode pads 16 of the controller chip 8 and the lead portion 4 via the metal wires 58. The electrode pads 16 of the controller chip 8 are further electrically connected to the lead portion 4 via the rewiring layer 56 and the metal wires 58. The memory card 71 also has the metal wire 59 that steps over a rewire or an electrode pad having a different electric potential, similar to the third embodiment.

When the controller chip 8 is disposed on the memory chip 9, it is possible configure the electric circuit by using the lead portion 4, the rewiring layer 56, the metal wires 58, 59 and the like, and to apply the rewiring layer 56 not only for connecting the controller chip 8 and the memory chip 9 but also for connecting the external connection terminals 3 and the controller chip 8. This enables to easily form the circuit for the controller chip 8 and the memory chip 9. The reduction in cost of the memory card 71 is realized by using the lead frame 2, and in addition to that, it is possible to enhance the formability of the circuit of the memory chip 9 and the controller chip 8 disposed on the memory chip 9. Therefore, it becomes possible to provide the memory card 71 excellent in practicability and reliability in an inexpensive manner.

In the memory cards 61, 71 of the fourth and fifth embodiments, the lead frame 2 in which the second processed portions 22 are provided at the connection portions between the lead portion 4 and the chip component mounting portions 5 is applied, similar to the first and second embodiments. However, it is possible to apply, depending on the shape of the chip components 7 and the formation position of the semiconductor chip mounting portion 6, the lead frame 2A having only the first processed portions 21 provided at the connection portions between the external connection terminals 3 and the lead portion 4, similar to the modified example of the memory card 51 of the third embodiment shown in FIG. 13. It is also possible that the memory cards 61, 71 of the fourth and fifth embodiments have the lead frame 2A which is flat except for the portions of the external connection terminals 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory card, comprising:
a lead frame including a plurality of external connection terminals, a lead portion having a plurality of leads, a chip component mounting portion provided to the lead portion, and a semiconductor chip mounting portion, at least part of the leads being connected to the external connection terminals;
a chip component mounted on the chip component mounting port ion and electrically connected to the lead portion;
a memory chip, disposed on the semiconductor chip mounting portion, having a chip body, first electrode pads formed on the chip body, an insulating resin film formed to cover a surface of the chip body while exposing the first electrode pads, and a rewiring layer formed on the insulating resin film;
a controller chip, disposed on the semiconductor chip mounting portion or the memory chip, having second electrode pads; and
a sealing resin layer sealing the chip component, the memory chip, the controller chip and the lead frame while exposing the external connection terminals,
wherein an electric circuit of the memory chip and the controller chip on the lead frame is formed by the leads, the rewiring layer, and a metal wire connected to at least one selected from the first electrode pad, the second electrode pad, the lead and the rewiring layer.

2. The semiconductor memory card according to claim 1, wherein the rewiring layer has a plurality of rewires, and
wherein at least part of the plural rewires has a first end portion electrically connected to the first electrode pad, and a second end portion electrically connected to the second electrode pad or the lead via the metal wire.

3. The semiconductor memory card according to claim 2, wherein the first end portion of the rewire is electrically connected to the first electrode pad directly or via the metal wire.

4. The semiconductor memory card according to claim 1, wherein the rewiring layer has a plurality of rewires, and
wherein the rewires having a same electric potential are electrically connected to via the metal wire disposed to step over the other rewire or an electrode pad having a different electric potential.

5. The semiconductor memory card according to claim 1, wherein the rewiring layer has an Al layer, an Al alloy layer, an Au layer or a Pd layer as at least an uppermost layer.

6. The semiconductor memory card according to claim 2, wherein the controller chip is disposed on the semiconductor chip mounting portion to be positioned between the external connection terminals and the memory chip.

7. The semiconductor memory card according to claim 6, wherein at least part of the second electrode pads is electrically connected to the lead via the metal wire.

8. The semiconductor memory card according to claim 1, wherein the memory chip includes a first memory chip disposed on the semiconductor chip mounting portion and a second memory chip stacked on the first memory chip, and
wherein the rewiring layer is provided only on the second memory chip.

9. The semiconductor memory card according to claim 8, wherein the second memory chip is stacked in a stepped manner to expose the first electrode pads of the first memory chip; and
wherein the first electrode pads of the first memory chip are electrically connected to the first electrode pads of the second memory chip or the rewiring layer via the metal wires, and the first electrode pads of the second memory chip are electrically connected to the rewiring layer.

10. The semiconductor memory card according to claim 9, wherein the second memory chip includes a chip stacked body having a plurality of memory chips.

11. The semiconductor memory card according to claim 1, wherein the controller chip is disposed on the memory chip, and a part of the second electrode pads is electrically connected to the lead via the rewiring layer and the metal wire.

12. The semiconductor memory card according to claim 1, wherein the lead frame includes a fixing portion having a hanging lead, and
wherein the semiconductor chip mounting portion is electrically independent of the fixing portion, and is held by a first fixing tape adhered to the fixing portion.

13. The semiconductor memory card according to claim 12, wherein the lead portion is held by a second fixing tape adhered to the fixing portion.

14. The semiconductor memory card according to claim 13, wherein the external connection terminals are held by a third fixing tape.

15. The semiconductor memory card according to claim 1, wherein the sealing resin layer has a first surface on which the external connection terminals are exposed and a second surface opposed to the first surface, and
wherein the lead frame has a first processed portion, and the first processed portion is formed by bending the lead frame to expose the external connection terminals on the first surface of the sealing resin layer and to be positioned the semiconductor chip mounting portion inside the sealing resin layer.

16. The semiconductor memory card according to claim 15, wherein the lead frame has a second processed portion, and the second processed portion is formed by bending the lead frame to be positioned the chip component mounting portion closer to the first surface of the sealing resin layer than the semiconductor chip mounting portion.

17. The semiconductor memory card according to claim 16, wherein the second processed portions are provided to be positioned a part of the lead portion except the chip component mounting portion and its peripheral area at approximately the same height as that of the semiconductor chip mounting portion, and
wherein the leads are held by a fixing tape adhered to the part of the lead portion disposed at approximately the same height as that of the semiconductor chip mounting portion.

18. A semiconductor memory card, comprising:
a lead frame including a plurality of external connection terminals, a lead portion having a plurality of leads, a chip component mounting portion provided to the lead portion, and a semiconductor chip mounting portion, at least part of the leads being connected to the external connection terminals;
a chip component mounted on the chip component mounting portion and electrically connected to the lead portion;
a memory chip, disposed on the semiconductor chip mounting portion, having first electrode pads;

a controller chip, disposed on the semiconductor chip mounting portion or the memory chip, having second electrode pads;

metal wires electrically connecting between the leads and the first electrode pads, between the leads and the second electrode pads, and between the first electrode pads and the second electrode pads; and a sealing resin layer sealing the chip component, the memory chip, the controller chip, the metal wires, and the lead frame while exposing the external connection terminals, wherein the sealing resin has a first surface on which the external connection terminals are exposed and a second surface opposed to the first surface, and wherein the lead frame has a first processed portion and a second processed portion, the first processed portion is formed by bending the lead frame to expose the external connection terminals on the first surface of the sealing resin layer and to be positioned the semiconductor chip mounting portion inside the sealing resin layer, and the second processed portion is formed by bending the lead frame to be positioned the chip component mounting portion closer to the first surface of the sealing resin layer than the semiconductor chip mounting portion.

19. The semiconductor memory card according to claim 18, wherein the second processed portions are provided to be positioned a part of the lead portion except the chip component mounting portion and its peripheral area at approximately the same height as that of the semiconductor chip mounting portion, and wherein the leads are held by a fixing tape adhered to the part of the lead portion disposed at approximately the same height as that of the semiconductor chip mounting portion.

20. A semiconductor memory card, comprising:

a lead frame including a plurality of external connection terminals, a lead portion having a plurality of leads, a chip component mounting portion provided to the lead portion, a fixing portion having a hanging lead, and a semiconductor chip mounting portion, at least part of the leads being connected to the external connection terminals;

a chip component mounted on the chip component mounting portion and electrically connected to the lead portion;

a memory chip, disposed on the semiconductor chip mounting portion, having first electrode pads;

a controller chip, disposed on the semiconductor chip mounting portion or the memory chip, having second electrode pads;

metal wires electrically connecting between the leads and the first electrode pads, between the leads and the second electrode pads, and between the first electrode pads and the second electrode pads; and a sealing resin layer sealing the chip component, the memory chip, the controller chip, the metal wires, and the lead frame while exposing the external connection terminals, wherein the semiconductor chip mounting portion is electrically independent of the fixing portion, and is held by a fixing tape adhered to the fixing portion.

* * * * *